United States Patent
Zenasni et al.

(10) Patent No.: US 8,999,440 B2
(45) Date of Patent: Apr. 7, 2015

(54) METHOD OF MANUFACTURING A STRUCTURE COMPRISING A GRAPHENE SHEET PROVIDED WITH METAL PINS, STRUCTURE THUS OBTAINED AND USE THEREOF

(75) Inventors: Aziz Zenasni, Gieres (FR); Johann Coraux, Grenoble (FR); Valentina Ivanova-Hristova, Grenoble (FR); Stefan Landis, Voiron (FR); Carole Pernel, St. Egreve (FR)

(73) Assignees: Centre National de la Recherche Scientifique, Paris (FR); Commissariat à l'énergie atomique et aux énergies alternatives, Paris (FR)

( * ) Notice: Subject to any disclaimer, the term of this patent is extended or adjusted under 35 U.S.C. 154(b) by 752 days.

(21) Appl. No.: 13/187,385

(22) Filed: Jul. 20, 2011

(65) Prior Publication Data
US 2012/0040145 A1     Feb. 16, 2012

(30) Foreign Application Priority Data
Jul. 21, 2010   (FR) ...................... 10 55937

(51) Int. Cl.
C23C 16/26     (2006.01)
B32B 3/30      (2006.01)
(Continued)

(52) U.S. Cl.
CPC ............. *C01B 31/04* (2013.01); *B81C 1/00126* (2013.01); *H01B 1/04* (2013.01); *H01L 29/1606* (2013.01); *H01M 4/139* (2013.01);
(Continued)

(58) Field of Classification Search
None
See application file for complete search history.

(56) References Cited

U.S. PATENT DOCUMENTS

2005/0260453 A1* 11/2005 Jiao et al. .............. 428/698
2009/0057649 A1*  3/2009 Sutter et al. ............ 257/15
(Continued)

FOREIGN PATENT DOCUMENTS

| EP | 2055673 A1 | 5/2009 |
|---|---|---|
| FR | 2946663 A1 | 12/2010 |
| WO | WO 2009/035213 A1 | 3/2009 |

OTHER PUBLICATIONS

Baby et al., "Metal decorated graphene nanosheets as immobilization matrix for amperometric glucose biosensor", Sensors & Actuators (2010) B 145(1):71-77.
(Continued)

*Primary Examiner* — Joseph Miller, Jr.
(74) *Attorney, Agent, or Firm* — Knobbe Martens Olson & Bear LLP

(57) ABSTRACT

A structure, method of manufacturing a structure, and methods of using a structure including a graphene sheet is disclosed. According to one aspect, the grapheme sheet is provided, on one of the faces of the structure, with a plurality of metal pins. The metal pins being separated from one another by a dielectric medium chosen from air and dielectric materials. The method including the steps of synthesizing, by vapor phase catalytic growth, the graphene sheet on a plurality of metal pins that are disposed on a membrane made from dielectric material or integrated in the membrane. The growth being catalyzed by the metal pins. According to some aspects, the membrane is removed from the structure. The structure may be used, for example, in the fields of micro- and nano-electronics, micro- and nanoelectronic engineering, spintronics, photovoltaics, light emitting diode display, or the like.

18 Claims, 2 Drawing Sheets

(51) Int. Cl.
*C01B 31/04* (2006.01)
*B81C 1/00* (2006.01)
*H01B 1/04* (2006.01)
*H01L 29/16* (2006.01)
*H01M 4/139* (2010.01)
*H01M 4/583* (2010.01)
*H01M 10/04* (2006.01)

(52) U.S. Cl.
CPC ......... *H01M 4/583* (2013.01); *H01M 10/0436* (2013.01); *Y02E 60/122* (2013.01)

(56) References Cited

U.S. PATENT DOCUMENTS

| | | |
|---|---|---|
| 2009/0155561 A1 | 6/2009 | Choi et al. |
| 2009/0224243 A1 | 9/2009 | Kobayashi et al. |
| 2011/0033677 A1 | 2/2011 | Shin et al. |
| 2013/0127023 A1 | 5/2013 | Zenasni |

OTHER PUBLICATIONS

Hofrichter et al., "Synthesis of Graphene on Silicon Dioxide by a Solid Carbon Source", Nano Letters, (2010) 10:.36-42.

Juang et al., "Synthesis of graphene on silicon carbide substrates at low temperature," Elsevier, Carbon (2009) 47:. 2026-2031.

Kim et al., "Large-scale pattern growth of graphene films for stretchable transparent electrodes", Nature (2009) 457(7230):706-710.

Li et al., "Large-Area Synthesis of High-Quality and Uniform Graphene Films on Copper Foils," Science (2009) 324(5932): 1312-1314.

Regan et al., "A direct transfer of layer-area graphene", Applied Physics Letters (2010), 96, 113102, 4 pages.

Reina et al., "Growth of Large-Area Single- and Bi-Layer Graphene by Controlled Carbon Precipitation on Polycrystalline Ni Surfaces," Nano Research, Tsinghua University Press and Springer-Verlag (2009) 2: 509-516.

Reina, et al., "Large Area, Few-Layer Graphene Films on Arbitrary Substrates by Chemical Vapor Deposition," Nano Letters, MIT (2009) 9(1): 30-35.

Sutter et al., "Graphene on Pt (111): Growth and substrate interaction," The American Physical Society, Physical Review B, 80, 245411, (2009).

Termium, Government of Canada Terminology and Linguistic Data Base "lattice parameter", Public Works and Government Services Canada; modified Sep. 1, 2014, 1 page.

Tiron et al., "Fabrication and Characterisation of nanoscale programmed defects for EUV lithography", Microelectronic Engineering (2006) 83(4-9):926-928.

Yavorski et al. [Eds] "Physics Aide-Mémoire: For the use of pupils in higher scientific and technical teaching", published by Mir, Moscow, 1975, 963 pages; TOC, 12 pages.

Search Report dated Apr. 29, 2011 for French Application No. 1055937.

Search Report dated Oct. 31, 2011 for European Application No. 11173602.

Search Report dated Mar. 9, 2012 for French Application No. 11 60126.

* cited by examiner

METHOD OF MANUFACTURING A STRUCTURE COMPRISING A GRAPHENE SHEET PROVIDED WITH METAL PINS, STRUCTURE THUS OBTAINED AND USE THEREOF

CROSS REFERENCE TO RELATED APPLICATIONS

This application claims the benefit of French Patent Application No. 1055937 filed on Jul. 21, 2010, the contents of which are incorporated herein by reference in their entirety.

TECHNICAL FIELD

The invention relates to the field of the manufacture of graphene sheets.

More specifically, the invention relates to a method that makes it possible to manufacture a structure comprising a graphene sheet provided, on one of the faces thereof, with metal pins, said metal pins being separated from one another by a dielectric medium chosen from air and dielectric materials.

It relates also to the structure thus obtained as well as to the uses of this structure.

A structure according to the invention is able to be used as such in very many technical fields, such as:
- micro- and nanoelectronics, for example for manufacturing transistors of the field effect transistor type or single-electron transistors, or connection structures for integrated circuits;
- micro- and nanoelectronic engineering, for example for the manufacture of micrometric or nanometric electromechanical resonators, more usually referred to by the abbreviations MEMS (standing for "Micro Electro-Mechanical Systems") and NEMS (standing for "Nano Electro-Mechanical Systems"),
- spintronics;
- photovoltaics; or
- light emitting diode display.

When the metal pins of this structure are separated from one another by a dielectric material, it is also able to be used as an intermediate product in the manufacture of a structure that comprises a graphene sheet provided, on one of the faces thereof, with a porous membrane made from dielectric material, this type of structure having in particular an advantage for the storage of hydrogen, fuel cells and microbatteries.

CONVENTIONAL ART

Graphene is a bidimensional carbon crystal that has a honeycomb hexagonal structure.

This crystal is provided with entirely surprising properties that currently make it a material highly prized by many public and private laboratories.

This is because graphene has firstly exceptional electronic mobility at ambient temperature, which may be as much as 20 $m^2/V·s$. By way of comparison, the electronic mobility of indium antimonide is, at ambient temperature, 2.5 times lower, that of silicon is 13 times lower while that of silver is 2500 times lower.

In addition, graphene is transparent since its thickness is that of one carbon atom, highly stable chemically, very light while being very strong on the mechanical level (200 times more that steel).

A certain number of techniques are known for synthesising graphene sheets such as the micromechanical exfoliation of a graphite crystal, electrochemical reduction of a graphene oxide, the opening of carbon nanotubes, the catalytic growth of graphene on a metal substrate or the sublimation of silicon carbide.

Among these techniques, the catalytic growth of graphene on a metal substrate (see for example K. S. Kim et al, Nature (2009), 457, 706-7410, [1]) appears to constitute one of the most promising methods for synthesising graphene on an industrial scale and enabling it to be integrated in devices of the micro- or nanoelectronic or micro- or nanoelectromechanical type or the like, which meet industrial standards.

This is because, through this technique, it has been possible to produce samples of graphene with high crystalline quality, characterised by monocrystalline domains extending over several hundreds of micrometers and through a unique crystallographic orientation on a macroscopic scale. Samples of graphene with centimetric surfaces have even been obtained, which is not the case with the other techniques for manufacturing graphene proposed at the present time.

However, manufacturing graphene by catalytic growth on a metal substrate has the major drawback of subsequently requiring a transfer of the graphene sheet from the metal substrate on which it has been formed to an insulating support if it is wished firstly to characterise this sheet optically and/or electrically (that is to say to study the optical and/or electrical properties thereof) and secondly to integrate it in a device of the aforementioned type (see for example W. Regan et al, *Applied Physics Letters* (2010), 96, 113102, [2]).

However, such transfer involves a succession of operations that involve the use of chemical etching solutions and resins and has the effect of generating defects that are both intrinsic (that is to say in the crystalline lattice) and extrinsic (curvatures, polar impurities, etc.) to the graphene, appreciably impairing the properties of this material.

In addition, in order to provide the graphene sheet with electrical contacts with a view to integration thereof in a device of the aforementioned type, it is necessary to carry out additional operations of lithography, etching and metallisation that further increase the risks of impairment of this sheet.

The inventors therefore set out to provide a method of manufacturing a graphite sheet of high crystalline quality, which is free from any transfer of this sheet from one substrate to another for subsequent use thereof and, in particular, for characterisation thereof or integration thereof in a device of the micro- or nanoelectronic or micro- or nanoelectromechanical type or the like, which meets industrial standards.

The inventors further set out that this method should have implementation costs that are compatible with exploitation on an industrial scale.

DESCRIPTION OF CERTAIN INVENTIVE ASPECTS

This aim and yet others are achieved by the invention, which proposes firstly a method of manufacturing a structure comprising a sheet of graphene that is provided on one of its faces with a plurality of metal pins, these pins being separated from one another by a dielectric medium chosen from air and dielectric materials, said method being characterised in that it comprises:

a) the synthesis, by vapor-phase catalytic growth, of the graphene sheet on a plurality of metal pins that are disposed on a membrane made from dielectric material or integrated in this membrane, this growth being catalysed by said metal pins; and optionally b) elimination of said membrane.

Thus, according to the invention, a structure is fabricated in which a graphene sheet is provided, on one of the faces thereof, with metal pins, without effecting any transfer of this sheet from one substrate to another, since it is synthesised directly on these metal pins.

As moreover the metal pins on which the graphene sheet is synthesised are disposed on a membrane made from dielectric material or integrated in this membrane, it suffices, once the graphene sheet has been formed, to eliminate or preserve said membrane in order to obtain a structure in which the metal pins fixed to the graphene sheet are separated from one another by air (if the membrane is eliminated) or by a dielectric material (if the membrane is preserved).

This graphene sheet can therefore easily be characterised on an optical and/or electrical level.

It can also be directly integrated in a device of the micro- or nanoelectronic or micro- or nanoelectromechanical type or the like, since the metal pins with which it is provided can in particular serve as electrical contacts or electrodes.

In the above and hereinafter, the expression "dielectric material" is taken in the meaning that is normally given to it in the field of electricity, namely that it designates a material that does not conduct an electric current (see for example the "Physics Aide-Mémoire: for the use of pupils in higher scientific and technical teaching", B. Yavorski & A. Detlaf, published by Mir, Moscow, 1975, 963 pages, [3]). In other words, the expression "dielectric material" is here synonymous with the expression "electrically insulating material".

As previously indicated, the graphene sheet is synthesised by vapor-phase catalytic growth because of the previously disclosed advantages that this graphene synthesis technique has, and it is the metal pins, which are arranged on the membrane made from dielectric material or integrated in this membrane, that serve as catalysts for this growth.

In the context of the invention, the vapor-phase catalytic growth of the graphene can be achieved by any technique that exposes the metal pins to gaseous-phase carbonaceous species such as:
- chemical vapor deposition, usually designated by the abbreviation CVD, in all the forms thereof: atmospheric pressure CVD (APCVD), low-pressure CVD (LPCVD), ultrahigh vacuum CVD (UHVCVD), aerosol assisted CVD (AACVD), direct liquid injection CVD (DLICVD), rapid thermal CVD (RTCVD), initiated CVD (i-CVD), atomic layer CVD (ALCVD), hot wire CVD (HWCVD), plasma enhanced CVD (PECVD), remote plasma enhanced CVD (RPECVD), microwave plasma enhanced CVD (MWPCVD), etc;
- physical vapor deposition, more often referred by the abbreviation PVD, in all forms thereof: cathodic sputtering PVD, vacuum evaporation PVD, ion beam sputtering PVD, arc PVD, for example cathodic, pulsed laser deposition, usually referred by the abbreviation PLD, etc; and
- hybrid physical-chemical vapor deposition, usually referred to by the abbreviation HPCVD.

Nevertheless, it is preferred for the catalytic growth of the graphene to be achieved by chemical vapor deposition, this technique in fact making it possible to control the crystalline quality of the graphene sheet obtained particular well.

In which case, the catalytic growth of the graphene is typically achieved by exposing, in the chamber or in one of the chambers of a CVD reactor, the membrane made from dielectric material provided with metal pins to a gaseous flow containing one or more saturated or unsaturated hydrocarbons, linear, branched or cyclic, such as, for example, methane ($CH_4$), ethane ($C_2H_6$), propane ($C_3H_8$), butane ($C_4H_{10}$), acetylene ($C_2H_2$), ethylene ($C_2H_4$), propylene ($C_3H_6$), propyne ($C_3H_4$), butylene ($C_4H_8$), butyne ($C_4H_4$), butadiene ($C_4H_6$), benzene ($C_6H_6$), or toluene ($C_7H_8$), optionally in a mixture with hydrogen or a hydrogenated compound such as for example $NH_3$ (the presence of which deoxidises the metal pins) and/or one or more neutral gases of the nitrogen, argon or helium type, at a temperature ranging from 200° to 2000° C. and at a pressure ranging from ultrahigh vacuum ($P \leq 10^{-6}$ Pa) to atmospheric pressure (P=101.325 kPa).

In this way a decomposition occurs of the hydrocarbons present in the gaseous flow into carbonaceous species, which are deposited on the metal pins and diffuse over the whole of the surface of these pins, and then the formation of graphene kernels on this surface (nucleation), which, in extending, finish up by joining together and forming a continuous sheet of graphene.

Preferably a gaseous flow is used comprising one or more C1 to C3 hydrocarbons, and even better, C1 or C2 such as methane, acetylene or ethylene, in a mixture with hydrogen, for example in a hydrocarbon/$H_2$ ratio of 1 to 10, at a temperature ranging from 800° to 1200° C.

In addition, it is preferred for the chemical vapor deposition to be a low pressure chemical vapor deposition (LPCVD) in which the pressure used is subatmospheric while being greater than $10^{-6}$ Pa.

Under these conditions, the time necessary for obtaining the formation of a graphene sheet is typically 1 to 20 minutes according to the temperature and pressure prevailing in the chamber, the flow of deoxidising agent, the time taken for deoxidation of the metal pins, the thickness of the metal pins and the flow of hydrocarbon(s).

The formation of the graphene sheet on the metal pins can be monitored by Raman spectroscopy, in particular verifying the appearance of the two peaks characteristic of graphene, namely peak G at 1580 $cm^{-1}$ and peak 2D at 2700 $cm^{-1}$.

Since, as previously mentioned, the graphene sheet is preferably formed by catalytic growth and it is the metal pins, which are arranged on the membrane made from dielectric material or integrated in this membrane, that serve as catalysts for this growth, these pins preferentially consist of a metal or an alloy of metals wherein the mesh parameter matches the mesh parameter of the graphene, it being considered that there is a match between these parameters if the mesh parameter of the metal or metals of the alloy does not differ by more than 2% from that of the graphene.

The mesh parameter of the graphene being 2.45 Å, the metal pins are therefore preferably formed from a metal or an alloy of metals the mesh parameter of which is greater than or equal to 2.401 Å and less than or equal to 2.499 Å.

Metals having such a mesh parameter are in particular nickel, copper, cobalt, ruthenium, palladium, iridium and platinum.

Among these, nickel is particularly preferred for its cost and its high melting point (1455° C.) and because it has a particularly good mesh parameter agreement with graphene.

It goes without saying that the use of metal pins consisting of one of the previously cited metals or an alloy of these metals is not reserved solely for the case where these pins are intended to serve as catalysts at step a) and can perfectly well be envisaged whatever the technique employed for forming the graphene sheet.

In accordance with the invention, the metal pins can be distributed over the membrane made from dielectric material or in this membrane in any way. In a similar manner, these pins can have any dimensions and be separated from one another by any distances.

However, it is preferred for the metal pins to be distributed in an ordered fashion and, more especially, that they form a lattice, that is to say a set of rows parallel to each other and columns perpendicular to these rows.

In which case this lattice preferably has a regular pitch, that is to say the distance that separates two adjacent pins is constant or substantially constant.

Moreover, it is preferred for the greatest extent of the metal pins measured in a direction parallel to the plane of the membrane made from dielectric material—which corresponds to the diameter of these pins in the case where they have the form of a cylinder of revolution or substantially this form—to be of a nanometric size, and for the distance that separates two adjacent metal pins also to be of a nanometric size.

In the above and hereinafter, "nanometric" means a dimension that is at least equal to 1 nanometer but is less than 1 micrometer.

Preferably the method according to the invention also comprises a step of producing metal pins, said step comprising the filling of openings in a support with a metal or metal alloy.

In relation to the above, it is preferred for the openings in this support to be distributed in an ordered fashion and, more especially, for them to form a lattice, that is to say a set of rows parallel to one another and columns perpendicular to these rows and for this lattice to have a regular pitch, that is to say the distance that separates two adjacent pins is constant or substantially constant.

Moreover, it is preferred for the greatest extent of the support openings measured in a direction parallel to the plane of the support to be of nanometric size and for the distance that separates two adjacent openings of the support also to be of nanometric size.

In a particularly preferred manner, the support is formed by the membrane made from dielectric material and the openings in this support correspond to pores in this membrane, with filling of said openings by the metal or metal alloy, which form a lattice and the greatest extent of which measured in a direction parallel to the plane of said membrane is of nanometric size.

This membrane can in particular be a membrane made of alumina, silica, a material of formula $Si_vO_wC_xH_z$ or $Si_vO_wC_x$-$N_yH_z$ in which v, w, x, y and z are all different from 0, a polymer such as polycarbonate or a polyethylene terephthalate, or a sequenced copolymer such as a copolymer of polymethyl methacrylate and polyethylene oxide (PPMA/PEO).

Membranes of this type are in some cases available commercially (polycarbonate and polyethylene terephthalate membranes for example). When such is not the case, they can be produced by anodic oxidation methods (for example in the case of an alumina membrane), which makes it possible to obtain a high pore density ($10^9$-$10^{12}$ pores/cm$^3$) having a diameter of 10 to 500 nm, lithography or photolithography followed by selective etching or UV-assisted nanoprinting, all these methods being well known to persons skilled in the art.

Advantageously, the pores of the membrane made from dielectric material are through pores, which makes it possible to fill these pores by electrodeposition, which is a highly selective technique while being inexpensive.

However, other techniques can be used for filling the pores, such as chemical vapor deposition (CVD), atomic layer deposition (ALD), plasma enhanced atomic layer deposition (PEALD) or metal organic chemical vapor deposition (MOCVD).

Another subject matter of the invention is a structure as obtained by the previously described method.

This structure is characterised in that it comprises a graphene sheet that is provided on one of its faces with metal pins, these pins being separated from one another by a dielectric medium chosen from air and dielectric materials and being disposed on said face in an ordered fashion.

Another subject matter of the invention is the uses of this structure.

As previously indicated, this structure is able to be used firstly as such in the manufacture of micro- or nanoelectronics, micro- or nanoelectronic engineering, spintronics or photovoltaic devices or light emitting diode display devices.

However, when the dielectric medium that separates the metal pins is a dielectric material, it is also able to be used in the manufacture of a structure comprising a graphene sheet provided, on one of its faces, with a porous membrane made from a dielectric material.

In which case this use comprises the elimination of the metal pins of said structure.

The structure thus obtained has in particular an advantage in producing devices devolved to the storage of hydrogen, fuel cells and microbatteries.

Other features and advantages of the invention will emerge from the remainder of the following description, which relates to examples of implementation of the method according to the invention and refers to the accompanying figures.

In these examples, "nanopins", "nanopores" and "nanowires" mean pins, pores and wires having the form of a cylinder of revolution or substantially this form and the diameter of which is nanometric.

It goes without saying that these examples are given only by way of illustration of the subject matter of the invention and under no circumstances constitute a limitation to this subject matter.

For reasons of clarity, the dimensions of the different elements shown in these figures are not in proportion to their actual dimensions.

DETAILED DESCRIPTION OF CERTAIN ILLUSTRATIVE EMBODIMENTS

Example 1

Figure 1A:
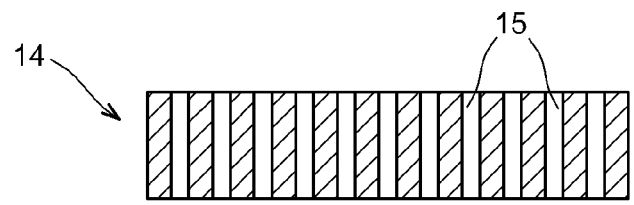
FIGS. 1A to 1D illustrate, in a schematic form, a first embodiment of the method according to the invention, designed to manufacture a structure comprising a graphene sheet that is provided on one of the faces thereof with a lattice of metal nanopins with a regular pitch, and in which these nanopins are separated from one another by air.
Figure 1B:
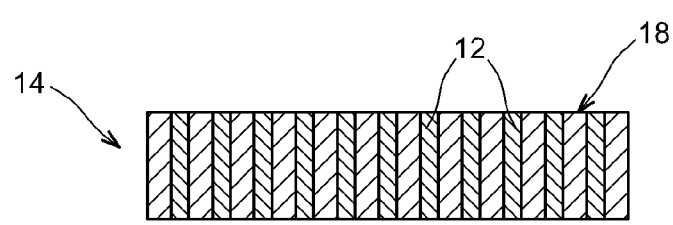
Figure 1C:
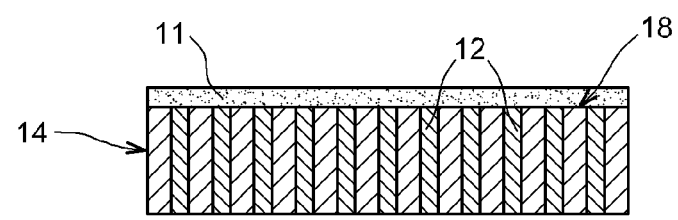
Figure 1D:
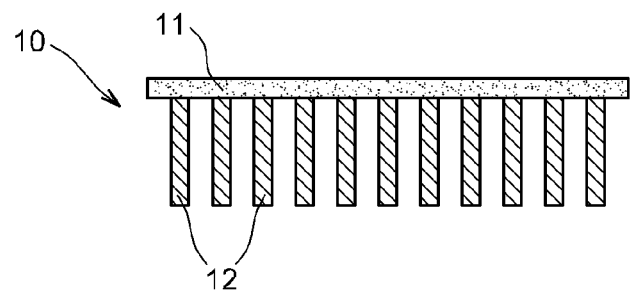

Reference is made first of all to FIGS. 1A to 1D, which illustrate schematically a first embodiment of the method according to the invention, designed to manufacture a structure 10 which, as can be seen in FIG. 1D, comprises a graphene sheet 11 that is integral with a lattice, with a regular pitch, of metal nanopins 12, more precisely nickel, and in which these nanopins are separated from one another by air.

In this embodiment, the method according to the invention comprises the following four steps:

1) preparation of an alumina membrane comprising a lattice of through nanopores, with a regular pitch, by anodic oxidation of an aluminium sheet;

2) production of nickel nanowires in the nanopores of the alumina membrane thus produced, by electrodeposition;

3) synthesis of a graphene sheet on the surface of the nanowires thus produced, by LPCVD; and then 4) elimination of the alumina membrane by chemical etching.

These steps are described in detail below.

Preparation of the Nanoporous Alumina Membrane:

An aluminium sheet measuring 1 μm thick is first of all subjected to annealing under neutral atmosphere (argon, helium or nitrogen) for 2 hours at 500° C. to reinforce the size of the metal grains and obtain homogeneous conditions for growth of the nanopores during subsequent anodic oxidation.

This sheet is then immersed for 30 seconds in a 5% soda solution, previously heated to 60° C., in order to pickle it, after which it is immersed for 10 seconds in an aqueous solution of 1.5 M nitric acid in order to neutralise it.

One of the faces of the aluminium sheet is then subjected to electropolishing for 20 seconds, which is carried out at ambient temperature, in a standard electropolishing bath (65% perchloric acid/ethanol/2-butoxyethanol/water), and applying 40 volts DC between this sheet, which serves as an anode, and a counter-electrode consisting of a graphite plate.

The mean roughness of the face thus electropolished is approximately 3 nm over an area of 3 μm$^2$.

This face is then subjected to a first anodic oxidation for a period of 15 hours, which is carried out in a bath at a temperature of 15° C., in a 3% aqueous solution of 0.5 M oxalic acid, and applying 40 volts DC between the aluminium sheet, which serves as anode, and a counter-electrode consisting of a platinum grille.

The alumina layer formed during this anodic oxidation is eliminated by wet etching, which is carried out at 60° C. using an aqueous solution containing 0.2 mol/l of chromic acid and 0.4 mol/l of phosphoric acid.

Then the previously anodised face of the aluminium sheet is subjected to a second anodic oxidation for a period of 5 hours, which is carried under the same conditions as those of the first anodic oxidation.

In this way the alumina membrane 14 is obtained, which is illustrated, in transverse section, in FIG. 1A and has a lattice of through nanopores 15.

These nanopores have a mean diameter of approximately 70 nm and are separated from one another by a substantially constant distance, around 110 nm.

Production of Nickel Nanowires:

The nickel nanowires being produced by electrodeposition, it is necessary to make the ends of the nanopores that emerge on one of the faces of the alumina membrane conductive before proceeding with this electrodeposition.

Because of this, a coating of gold 10 nm thick is first of all deposited on one of the faces of the alumina membrane by vacuum evaporation, using a mask so that this deposition takes place only on the ends of the nanopores emerging on this face.

When the electrodeposition is carried out, at a temperature of 20° C., in an electrolytic bath composed of 200 g/l of a mixture of nickel chloride ($NiCL_2$) and water (1/1, v/v), 120 g/l of a mixture of nickel sulphate ($NiSO_4$) and water (1.7, v/v), and 50 g/l of boric acid, the pH of which has previously been adjusted to 4 by adding soda, applying 10 volts DC for 90 minutes between the working electrode, which is formed by the coating of gold covering the ends of the nanopores, and a counter-electrode that consists of a stainless steel plate.

The nickel deposited in excess, that is to say corresponding to the part of the nanowires formed outside the nanopores of the alumina membrane, is eliminated by selective mechanical/chemical polishing, which is carried out using a 0.1% solution of hydrogen peroxide as an oxidant, and a 4.6% by weight slurry of alumina particles measuring on average 180 nm in diameter as an abrasive. The linear polishing speed is 10 cm/min and the pressure applied is 5.1 psi (34.47 kPa). The polishing time for each pass is adjusted according to the thickness of the nickel that is to be removed.

In this way the structure is obtained that is illustrated, seen in transverse section, in FIG. 1B and in which the alumina membrane 14 comprises a lattice of nickel nanopins 12 that are integrated in this membrane and one of the ends of which, referenced 17, fits flush with one of the faces, referenced 18, of said membrane.

These nickel nanopins, the means diameter and the spacing of which are the same as those of the nanopores in which they were formed (70 nm approximately for the diameter, 110 nm approximately for the spacing), are suitable for serving as catalysts in the following step.

Synthesis of the Graphene Sheet:

The structure illustrated in FIG. 1B is introduced into the chamber of an LPCVD reactor and arranged on a plate the temperature of which is raised to 1000° C. in steps of 50° C. and is maintained at this temperature for 10 minutes, at a pressure of 0.5 torr (0.0666 kPa) and a flow of argon of 200 cm$^3$/min.

Then, the temperature and pressure conditions being kept constant, the structure is successively subjected to:

a flow of hydrogen (having a deoxidising role) of 1000 cm$^3$/min for 2 minutes, and a flow of hydrogen of 1000 cm$^3$/minute to which a flow of ethylene of 200 cm$^3$/min is added.

After which it is cooled either in the chamber of an LPCVD reactor or in a chamber devolved for this purpose, under vacuum or under atmosphere of a neutral gas of the nitrogen, argon or helium type, at 10° C./min.

In this way the structure is obtained that is illustrated, seen in transverse section, in FIG. 1C and comprises a graphene sheet 11 extending over the entire face 18 of the alumina membrane 14 and being formed by nucleation of graphene on the nickel nanopins 12, growth of the cores thus formed in graphene surfaces and confluence of these surfaces.

Removal of the Alumina Membrane:

The alumina membrane of the structure illustrated in FIG. 1C is removed by chemical etching that is carried out by immersing the structure for 10 minutes in a 2 M aqueous solution of soda, the temperature of which is 20° C. After which, the structure is rinsed with deionised water several times (at least 5 times) and is then dried for 30 minutes in a chamber heated to 300° C., under a flow of nitrogen.

In this way the structure 10 is obtained that is illustrated, seen in transverse section, in FIG. 1D, which comprises a graphene sheet 11 that is integral with the lattice of nickel nanopins 12 and in which these nanopins are separated from one another by air.

Example 2

Figure 2A:
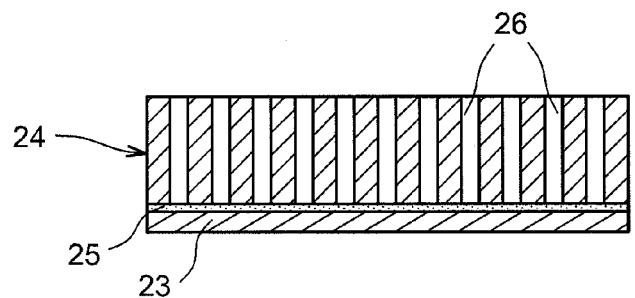
FIGS. 2A to 2C illustrate, in a schematic form, a second embodiment of the method according to the invention, designed for manufacturing a structure comprising a graphene sheet that is provided on one of the faces thereof with a lattice of metal nanopins with a regular pitch and in which these nanopins are separated by a dielectric material.
Figure 2B:
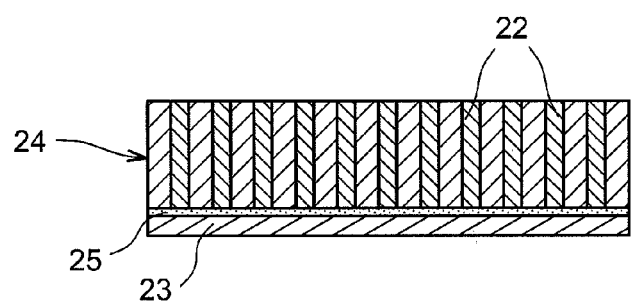
Figure 2C:
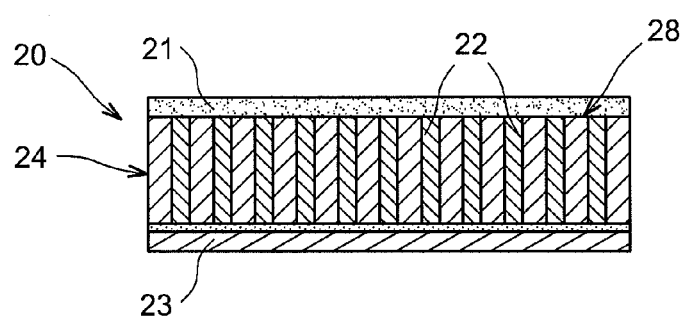

Reference is now made to FIGS. 2A to 2C, which illustrate schematically a second embodiment of the method according to the invention that is distinguished from the previous one in that it is designed to manufacture a structure in which the nickel nanopins are separated from one another by a dielectric material, in this case SiOCH.

Because of this, in this embodiment, the method according to the invention comprises the following 3 steps:

1) the preparation, by PECVD followed by electron beam lithography, of an SiOCH membrane comprising a lattice of through nanopores, with a regular pitch;

2) the production, by electrodeposition, of nickel nanowires in the nanopores in the membrane thus produced; and 3) the synthesis, by LPCVD, of a graphene sheet on the nickel nanowires thus produced.

Preparation of the Nanoporous SiOCH Membrane:

A coating of nickel 5 nm thick is first of all deposited by PVD on the surface of a silicon substrate with a crystalline orientation of 100, using a mask for depositing this coating of nickel solely on predetermined areas, corresponding to the future locations of the nanopores in the SiOCH membrane intended to be formed next on this substrate.

Then a coating of SiOCH 200 nm thick is deposited by PECVD on the face of the substrate partially covered with nickel.

This deposition is carried out in one of the capacitive coupling chambers of a Centura™ DXZ 200 nm from Applied Materials, arranging the substrate on a substrate carrier heated to 300° C. and using the following operating parameters:

radio-frequency plasma: 13.56 MHz;
working pressure: 5 torrs (666 Pa);
power: 600 W;
diethoxymethylsilane (DEMS) flow: 1000 cm$^3$/min;
helium flow: 1000 cm$^3$/min;
duration of deposition: 30 seconds.

After cooling, the coating of SiOCH thus formed is subjected to electron beam lithography, which is carried out as described by T. Raluca et al. in *Microelectronic Engineering* (2006), 83, 926, [4], using a mask so that the bottom of the nanopores formed by this lithography in said SiOCH coating coincides with the areas of the substrate that were covered with nickel.

The structure is thus obtained that is illustrated, seen in transverse section, in FIG. 2A.

This structure comprises a silicon substrate 23 that is locally covered with a coating of nickel 25, which are themselves covered with an SiOCH membrane 24 that has a lattice of through nanopores 26, the mean diameter of which is approximately 40 nm and are separated from one another by a constant distance of around 40 nm.

Production of Nickel Nanowires:

The nickel nanowires are produced following the same electrodeposition protocol as the one used in example 1 above except that, in this case, it is the coating of nickel 25 that serves as a working electrode.

Here also, the nickel deposited in excess, that is to say corresponding to the part of the nanowires that was formed outside the nanopores in the alumina membrane, is removed by selective mechanical/chemical polishing, which is carried out in the same way as in example 1 above.

In this way the structure is obtained that is illustrated, seen in transverse section, in FIG. 2B and in which the SiOCH membrane 24 comprises a lattice of nickel nanopins 22 that are integrated in this membrane and the ends of which each fit flush with one of the faces of said membrane.

These nickel nanopins, the mean diameter and spacing of which are the same as those of the nanopores in which they were formed (40 nm approximately for the diameter, 40 nm approximately for the spacing), are suitable for serving as catalysts in the following step.

Synthesis of the Graphene Sheet:

The graphene sheet is synthesised using the same LPCVD protocol as the one used in example 1 above.

At the end of this step the structure 20 is obtained which is illustrated, seen in transverse section, in FIG. 2C.

This structure comprises a graphene sheet 21 that extends over the entire face, referenced 28, of the SiOCH membrane 24 that is opposite to the one in contact with the silicon substrate 23, and which is formed by graphene nucleation on the nickel nanopins 22 in this membrane, growth of the cores thus formed as graphene surfaces and confluence of these surfaces.

This structure can be used as it stands, for example in interconnection structures for integrated circuits or electromechanical nanosystems (NEMS).

However, for other applications, it is possible to remove the nickel nanopins 22 from the SiOCH membrane 24, for example by wet etching that can be carried out by immersing the structure 20 for a few minutes in a 1M aqueous solution of ferric chloride (ClFe$_3$).

Etching of this type makes it possible in fact to remove the nickel nanopins 22 from the structure 20 without gaseous products or precipitates forming and consequently without the graphene sheet 21 being damaged.

Figure 3:
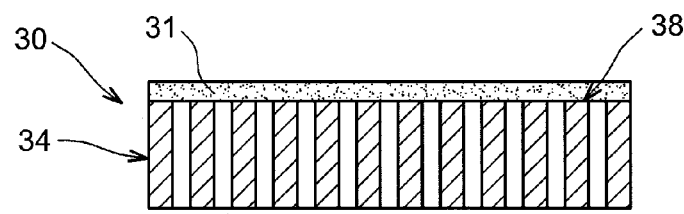
FIG. 3 illustrates, in a schematic form, a structure comprising a graphene sheet that is provided on one of the faces thereof with a porous membrane made from a dielectric material, and having been obtained from the structure illustrated in FIG. 2C.

In this way the structure 30 is obtained which is illustrated, seen in transverse section, in FIG. 3.

This structure comprises a graphene sheet 31 that extends over one of the faces, referenced 38, of a nanoporous SiOCH membrane 34.

REFERENCES CITED

[1] K. S. Kim et al, *Nature* (2009), 457, 706-7410
[2] W. Regan et al, *Applied Physics Letters* (2010), 96, 113102
[3] "Physics Aide-Mémoire: For the use of pupils in higher scientific and technical teaching", B. Yavorski & A. Detlaf, published by Mir, Moscow, 1975, 963 pages
[4] T. Raluca et al, *Microelectronic Engineering* (2006), 83, 926

The invention claimed is:

1. A method of manufacturing a structure comprising a graphene sheet having a first face and a second face, the first face being provided with a plurality of metal pins, the metal pins being separated from one another by a dielectric medium selected from air and dielectric materials, said method comprising:

synthesizing, by vapor phase catalytic growth, the graphene sheet on a plurality of metal pins, the metal pins being disposed on a membrane made from a dielectric material or integrated in the membrane, wherein the catalytic growth is catalysed by the metal pins, wherein the metal pins are formed of a metal or a mixture of metals, the metal(s) having a lattice parameter within about 2% of a lattice parameter of the graphene.

2. The method of claim 1, wherein the vapor phase catalytic growth comprises chemical vapor deposition.

3. The method of claim 2, wherein the chemical vapor deposition is carried out with a gaseous flow comprising at least one hydrocarbon at a temperature ranging from about 200° C. to about 2000° C. and at a pressure ranging from ultrahigh vacuum pressure to atmospheric pressure.

4. The method of claim 2, in which the chemical vapor deposition is carried out with a gaseous flow comprising at least one C1 to C3 hydrocarbon at a temperature ranging from about 800° C. to about 1200° C. and at a pressure less than atmospheric pressure and greater than $10^{-6}$ Pa.

5. The method of claim 1, wherein the metal pins are formed of a metal or a mixture of metals selected from the group consisting of nickel, copper, cobalt, ruthenium, palladium, iridium and platinum.

6. The method of claim 5, wherein the metal pins are formed of nickel.

7. The method of claim 1, wherein the metal pins form a lattice.

8. The method of claim 7, wherein the lattice has a regular pitch.

9. The method of claim 7, wherein a length of the metal pins measured in a direction parallel to a plane of the membrane made from the dielectric material is greater than 1 nm and less than 1 μm.

10. The method of claim 7, wherein two adjacent metal pins are separated from one another by a distance equal to a distance that is greater than 1 nm and less than 1 μm.

11. The method of claim 1, further comprising producing the metal pins, wherein producing the metal pins comprises filling openings in a support with a metal or metal alloy.

12. The method of claim 11, wherein the openings in the support form a lattice.

13. The method of claim 12, wherein the lattice has a regular pitch.

14. The method of claim 11, wherein a length of the openings in the support measured in a direction parallel to a plane of the support is greater than 1 nm and less than 1 μm.

15. The method of claim 11, wherein two adjacent openings in the support are separated the one from another by a distance equal to a distance that is greater than 1 nm and less than 1 μm.

16. The method of claim 11, wherein the support is formed by the membrane made from the dielectric material, and wherein the openings in the support correspond to pores that comprise the membrane before filling of said openings by the metal or metal alloy, the pores forming a lattice and having a length measured in a direction parallel to a plane of said membrane which is equal to a length that is greater than 1 nm and less than 1 μm.

17. The method according to claim 16, wherein the membrane is formed of a material selected from the group consisting of alumina, silica, a material having a formula $Si_vO_wC_yH_z$ or $Si_vO_wC_xN_yH_z$ in which v, w, x, y and z are nonzero coefficients, a polymer and a sequenced copolymer.

18. The method according to claim 1, further comprising removing the membrane.

* * * * *